(12) United States Patent
LaGrange et al.

(10) Patent No.: US 10,401,137 B2
(45) Date of Patent: *Sep. 3, 2019

(54) RETENTION MEMBER FOR PERFORATING GUNS

(71) Applicant: OWEN OIL TOOLS LP, Houston, TX (US)

(72) Inventors: Timothy E. LaGrange, Blackfalds (CA); Lyle W. Andrich, Grandview, TX (US); Cory D. Day, Burleson, TX (US); Dan W. Pratt, Benbrook, TX (US)

(73) Assignee: OWEN OIL TOOLS LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/349,659

(22) Filed: Nov. 11, 2016

(65) Prior Publication Data

US 2017/0059293 A1 Mar. 2, 2017

Related U.S. Application Data

(63) Continuation of application No. 11/759,126, filed on Jun. 6, 2007, now Pat. No. 9,520,219.

(60) Provisional application No. 60/811,281, filed on Jun. 6, 2006.

(51) Int. Cl.
| | |
|---|---|
| *F42D 1/04* | (2006.01) |
| *E21B 43/117* | (2006.01) |
| *G08B 13/24* | (2006.01) |
| *H01F 10/13* | (2006.01) |
| *H01L 41/20* | (2006.01) |

(52) U.S. Cl.
CPC ............ *F42D 1/043* (2013.01); *E21B 43/117* (2013.01); *G08B 13/2437* (2013.01); *G08B 13/2442* (2013.01); *H01F 10/131* (2013.01); *H01L 41/20* (2013.01); *Y10T 29/49826* (2015.01); *Y10T 428/239* (2015.01)

(58) Field of Classification Search
CPC ... F42D 1/043; E21B 43/117; G08B 13/2437; G08B 13/2442; H01F 10/131; H01L 41/20; Y10T 428/239; Y10T 29/49826
USPC ..................................................... 102/275.12
See application file for complete search history.

(56) References Cited

U.S. PATENT DOCUMENTS

| | | |
|---|---|---|
| 2,799,224 A | 7/1957 | Long |
| 3,036,521 A | 5/1962 | Owen |
| 3,444,810 A | 5/1969 | Hakala |
| 3,650,212 A | 3/1972 | Bauer |
| 3,807,675 A | 4/1974 | Seckerson et al. |
| 4,193,460 A | 3/1980 | Gilbert |

(Continued)

*Primary Examiner* — Michelle Clement
(74) *Attorney, Agent, or Firm* — Mossman, Kumar & Tyler PC

(57) ABSTRACT

A perforating gun includes a charge tube having shaped charges affixed thereto. Each shaped charge includes a radially outward pointing post adapted to receive a detonator cord. A retention member installed on the post provides a compressive force that energetically couples the detonator cord to the post. The radially outermost portion of the retention member is radially flush with or radially recessed relative to the radially outermost portion of each post. In one embodiment, the retention member has a rounded medial portion, a central opening and a pair of locking tabs that point radially inward to the central opening. Each post may include a slot for receiving the detonator cord and a circumferential groove that is adapted to receive the locking tabs.

5 Claims, 6 Drawing Sheets

(56) References Cited

U.S. PATENT DOCUMENTS

| | | |
|---|---|---|
| 4,312,273 A | 1/1982 | Camp |
| 4,326,462 A | 4/1982 | Garcia et al. |
| 4,428,440 A | 1/1984 | McPhee |
| 4,519,313 A | 5/1985 | Leidel |
| 4,753,301 A | 6/1988 | Berry |
| 4,773,299 A | 9/1988 | Oestreich et al. |
| 4,832,134 A | 5/1989 | Gill |
| 4,852,495 A | 8/1989 | Hancock et al. |
| 4,881,445 A | 11/1989 | Hayes |
| 4,885,993 A | 12/1989 | Hancock et al. |
| 4,889,183 A | 12/1989 | Sommers et al. |
| 4,915,029 A | 4/1990 | Appledorn et al. |
| 4,961,365 A | 10/1990 | Rytlewski |
| 5,007,486 A | 4/1991 | Ricles |
| 5,054,564 A | 10/1991 | Oestreich et al. |
| 5,088,557 A | 2/1992 | Ricles et al. |
| 5,107,929 A | 4/1992 | Lopez de Cardenas |
| 5,241,891 A | 9/1993 | Hayes et al. |
| 5,460,095 A | 10/1995 | Slagle et al. |
| 5,542,480 A | 8/1996 | Owen et al. |
| 5,544,711 A | 8/1996 | Aitken et al. |
| 5,564,499 A | 10/1996 | Willis et al. |
| 5,598,891 A | 2/1997 | Snider et al. |
| 5,648,635 A | 7/1997 | Lussier et al. |
| 5,662,178 A | 9/1997 | Shirley et al. |
| 5,701,964 A | 12/1997 | Walker et al. |
| 5,775,426 A | 7/1998 | Snider et al. |
| 5,785,130 A | 7/1998 | Wesson et al. |
| 6,098,707 A | 8/2000 | Pastusek et al. |
| 6,158,511 A | 12/2000 | Wesson |
| 6,244,157 B1 | 6/2001 | Tseka |
| 6,439,121 B1 | 8/2002 | Gillingham |
| 6,591,911 B1 | 7/2003 | Markel et al. |

RETENTION MEMBER FOR PERFORATING GUNS

CROSS-REFERENCE TO RELATED APPLICATIONS

This application is a Continuation of U.S. Ser. No. 11/759,126, filed Jun. 6, 2007, which also claims priority from U.S. Provisional Patent application Ser. No. 60/811,281 filed Jun. 6, 2006, the entire disclosure of which is incorporated herein by reference in its entirety.

BACKGROUND OF THE INVENTION

Field of the Invention

The present invention relates to devices and methods for energetically coupling a detonator cord to one or more shaped charges.

Description of the Related Art

Hydrocarbons, such as oil and gas, are produced from cased wellbores intersecting one or more hydrocarbon reservoirs in a formation. These hydrocarbons flow into the wellbore through perforations in the cased wellbore. Perforations are usually made using a perforating gun loaded with shaped charges. The gun is lowered into the wellbore on electric wireline, slickline, tubing, coiled tubing, or other conveyance device until it is adjacent to the hydrocarbon producing formation. Thereafter, a surface signal actuates a firing head associated with the perforating gun, which then detonates the shaped charges. Projectiles or jets formed by the explosion of the shaped charges penetrate the casing to thereby allow formation fluids to flow through the perforations and into a production string.

Referring now to FIG. 1A, there is shown a conventional perforating gun 10. The gun 10 includes a charge strip or tube 12, concentrically positioned in a carrier tube 14. Fixed within the charge tube 12 are shaped charges 16. Typically, the charge tube 12 is oriented in the carrier tube 14 such that the shaped charges 16 on each charge strip (not shown) align with weakened portions or scallops 18 formed in the carrier tube 14. A detonator cord 20 runs through suitable bores (not shown) in the perforating gun 10. Referring now to FIG. 1B, there is shown a cross-sectional view of the FIG. 1A perforating gun 10. Conventionally, the detonator cord 20 is coupled to the shaped charge 16 with an external clip 28. As is known, the shaped charge 16 may not detonate if the detonator cord 20 is not held firmly within a groove 30 formed in a post 31 extending from the rear of the shaped charge 16. Thus, in a typical assembly sequence, the shaped charges 16 are fixed within the charge tube 12 and then the detonator cord 20 is run through the grooves 30 of the shaped charges 16. Thereafter, the external clips 28 are snapped over the grooves 30 to retain the detonator cord 20 within the grooves 30. Next, the charge tube 12 is slid into the carrier tube 14. It should be noted that the annular clearance space 32 separating the charge tube 12 and the carrier tube 14 is relatively small in the region of the groove 30 and external clip 28. It should be noted that conventionally, the external clip 28 lies radially outward of the post 31 formed on the shaped charge 16. Disadvantageously, during installation of the charge tube 12 in the carrier tube 14, the external clip 28 sometimes hangs up with, gets caught by, and/or scrapes against the carrier tube 14 and becomes dislodged or damaged. If the external clip 28 is so damaged, the detonator cord 20 can fall out of the groove 30, in which case the shaped charge 16 may not detonate. An incomplete detonation of the shaped charges 16 can impair the effectiveness of the perforating activity and necessitate remedial work.

Thus, what is needed is a perforating gun that can be assembled without impairing the ballistic coupling of the detonator cord to the shaped charges. The present invention addresses these and other disadvantages of the prior art.

SUMMARY OF THE INVENTION

In some aspects, the present invention provides a perforating gun for perforating a wellbore that has enhanced energetic couplings between the detonator cord and the shaped charges. In one embodiment, the gun includes a charge tube disposed in a carrier tube and shaped charges fixed in the charge tube. Each shaped charge has a body or casing on which is formed a radially outward pointing, substantially cylindrical post. The post has a slot that receives a detonator cord. To ensure that the detonator cord remains energetically coupled to the shaped charge, a retention member installed on the post captures the detonator cord and compresses the cord against the post.

In some embodiments, only a minor portion of the retention member in contact with the detonator cord extends radially beyond the radially outermost portion of each post. In other words, a major portion of the retention member is radially recessed relative to the radially outermost portion of the post. As used herein, "a major portion" means at least slightly more than half, and in some embodiments significantly more than half. In other embodiments, substantially all of the retention member lies radially flush with or is radially recessed relative to the radially outermost portion of each post. When the charge tube is inserted into the carrier tube during installation, a significantly smaller portion of the retention member, in comparison with conventional means, is likely to undesirably contact either an edge or the interior of the carrier tube. Thus, it is less likely that the retention member will in some way strike the carrier tube as a result of mishandling. Because the retention member is therefore less likely to be damaged or dislodged during such mishandling, there is a correspondingly greater likelihood that the energetic coupling between the detonator cord and the shaped charges will remain intact during assembly and subsequent deployment, increasing the likelihood of a successful perforating operation.

Furthermore, embodiments of retention members in accordance with the present invention include a portion that restricts movement of the retention member along a long axis of the charge tube. Such a portion can restrict movement by bumping up against or otherwise interferingly engaging with a post. For instance, in one embodiment, the retention member is formed as a generally plate like member having a curved medial portion, a central opening and a pair of locking tabs that point radially inward to the central opening. The central opening is defined by two bridge portions that are spaced apart along the long axis of the charge tube. The post of the shaped charge includes a slot for receiving the detonator cord and a circumferential groove that is adapted to receive the locking tabs of the retention member. During installation, the detonator cord is positioned in the post slot and the retention member is positioned over and pressed onto the post. As the post enters the central opening, the locking tabs interferingly engage the outer surfaces of the post and deform. Once the locking tabs reach the circumferential groove, the tabs spring back to their original shape and seat within the groove. When so positioned, the detonator cord is nested in the curved medial portion and squeezed against the shaped charge, i.e., squeezed in the post slot, by the retention member. Advantageously, if the retention member is axially jarred, one of the bridge portions will strike the post and thereby restrict further axial motion and possible dislodgement of the retention member from the post. To remove the retention member, tool such as a rod or shaft is inserted into a slot or hole formed in the retention member. The shank member is positioned against the post and rotated to apply a dislodging force to the retention member.

In another embodiment, the retention member includes two pairs of fingers formed in the medial region. The fingers are two spaced apart elements that can have a bow-like shape for securing the detonator cord. For this embodiment, during installation, the retention member is first positioned over and pressed onto the post until the locking tabs seat within the groove. Thereafter, the detonator cord is pressed between the fingers and positioned in the post slot. The so-called "tips" of the fingers may remain radially flush with or recessed relative to the radially outermost portion of the post.

It should be understood that examples of the more important features of the invention have been summarized rather broadly in order that the detailed description thereof that follows may be better understood, and in order that the contributions to the art may be appreciated. There are, of course, additional features of the invention that will be described hereinafter and which will in some cases form the subject of the claims appended hereto.

BRIEF DESCRIPTION OF THE DRAWINGS

For detailed understanding of the present invention, references should be made to the following detailed description of the preferred embodiments, taken in conjunction with the accompanying drawings, in which like elements have been given like numerals and wherein.

DESCRIPTION OF THE INVENTION

Figure 1A:
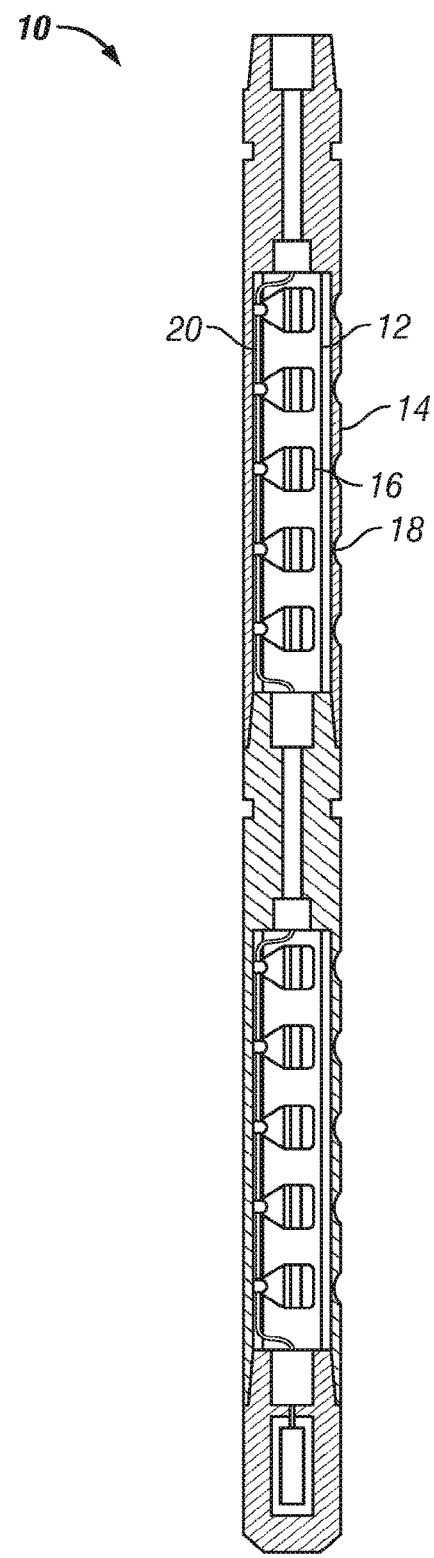
FIG. 1A schematically illustrates a conventional perforating gun train.

The present invention relates to devices and methods for facilitating the assembly and enhancing the reliability of wellbore perforating tools. The present invention is susceptible to embodiments of different forms. There are shown in the drawings, and herein will be described in detail, specific embodiments of the present invention with the understanding that the present disclosure is to be considered an exemplification of the principles of the invention, and is not intended to limit the invention to that illustrated and described herein.

Figure 2:
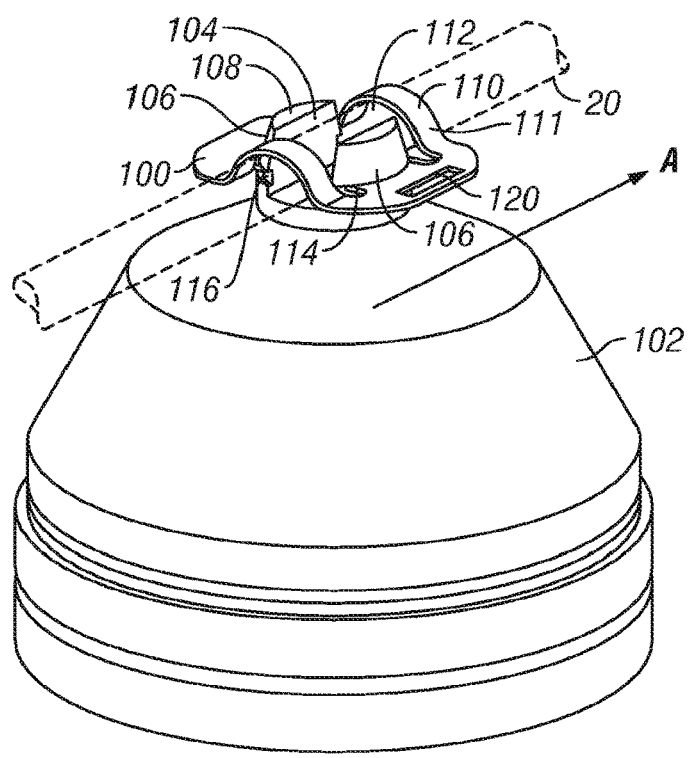
FIGS. 2 and 3 schematically illustrate one embodiment of a detonator cord retention member according to the present invention.
Figure 3:
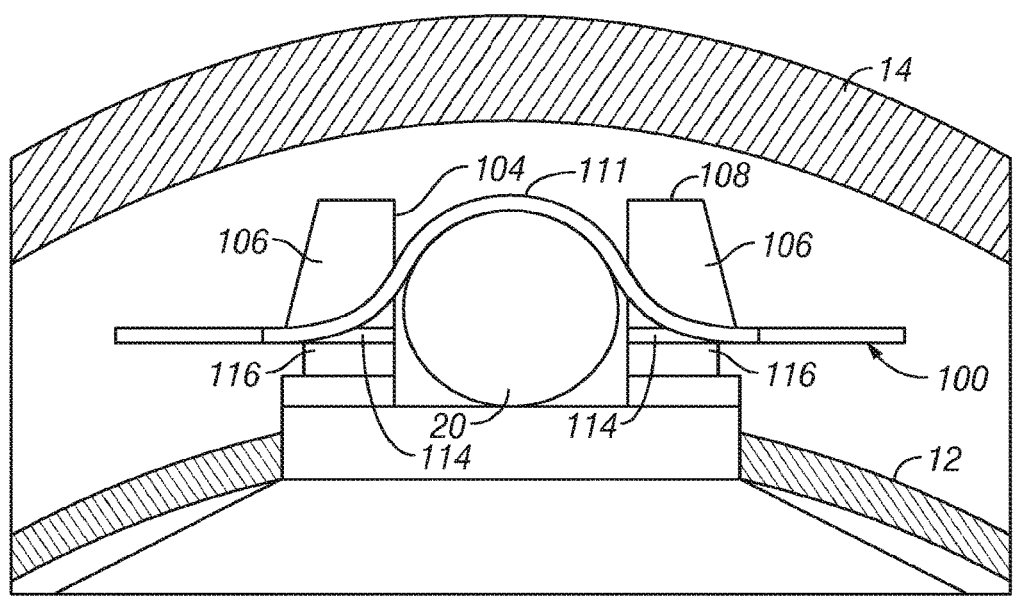

Referring now to FIGS. 2 and 3, there is shown one embodiment of a retention member 100 that energetically couples a detonator cord 20 to a shaped charge 102. The detonator cord 20 and shaped charge 102 are generally similar to that already described in connection with FIG. 1A. Merely for convenience, the retention member 100 will be hereafter referred to as a "clip." However, it should be understood that no particular shape, dimension or other characteristic is implied by the term "clip." As will be seen, the clip 100 is less susceptible to damage during assembly and handling.

The clip 100 presses a detonator cord 20 against the shaped charge 102 to energetically couple the detonator cord 20 to the shaped charge 102. The clip 100 secures onto a post 106 formed on one end of the shaped charge 102, i.e., the portion opposite the liner (not shown). The detonator cord 20 is captured in a slot 104 formed in the post 106. In one embodiment, only a radially outermost portion of the clip 100 lies radially beyond the posts 106. This portion is generally defined by a section of the clip 100 in contact with the detonator cord 20. Thus, when compared to the conventional clip 28 shown in FIG. 1B, a significantly reduced portion of the clip 100 would be susceptible to contact with a carrier tube 14 when the charge tube 12 is slid into the carrier tube 14 during assembly of a perforating gun. In other embodiments of the present invention, substantially all of the clip 100 lies radially flush with or is radially recessed from the radially outermost portion of each post 106.

Figure 1B:
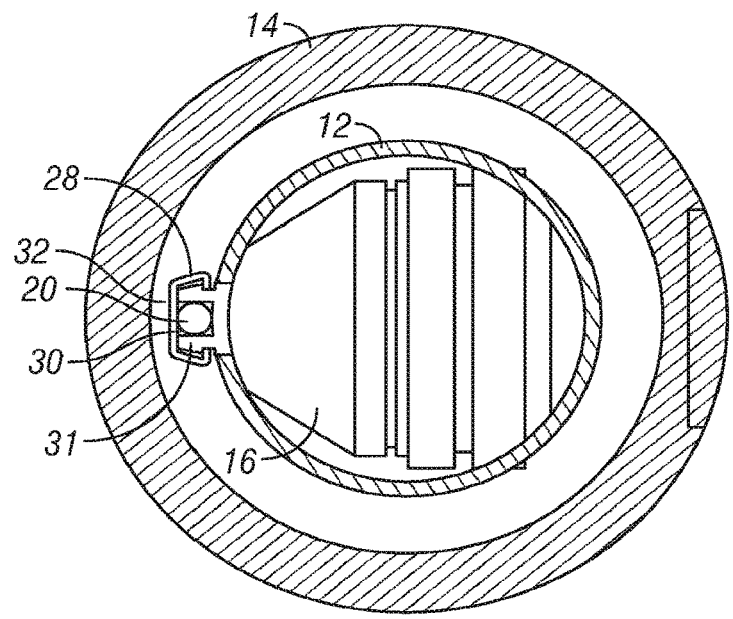
FIG. 1B schematically illustrates a sectional view of the FIG. 1A perforating gun.

In one embodiment, the clip 100 is a thin plate like member that includes an arcuate or curved medial portion 110, a central opening 112, and radially inwardly pointing tabs 114. The medial portion 110 is shaped to overlie the detonator cord 20. The height and thickness of the medial portion 110 are controlled to minimize the amount of the medial portion 110 that extends radially beyond the post 106. While the medial portion 110 is shown as closely conforming to the cross-sectional profile of the detonator cord 20, such a shape is not necessary. Other adequate shapes can include squared or circular profiles. The medial portion 110 includes one or more bridge portions 111 that are spaced apart along a long axis A of the perforating gun 10 (FIG. 1A). The bridge portion 111 is also shown in FIG. 3. For purposes of this discussion, a radial direction is a direction normal or orthogonal to the long axis A. The central opening 112 has a diameter sized to fit substantially around the post 106. The inwardly pointing tabs 114 are flexible members that are adapted to snap and seat within a circumferential groove 116 formed on the outer circumferential surface of the post 106. In one arrangement, the clip 100 and the post 106 are relatively dimensioned such that the clip 100 applies a compressive force onto the detonator cord 20 when installed in the post 106. Optionally, a handling slot 120 can be formed in the clip 100. The handling slot 120 is dimensioned to receive a removal tool such as a screwdriver shank or other device that can be used to manipulate the clip 100. Further, while two bridge portions 111 are shown, a single bridge portion can also be used in certain embodiments.

During assembly of a perforating gun, the shaped charge 12 is fitted into a charge tube 14 and the detonator cord 20 is wound or threaded through the slots 104 formed in the posts 106 of the shaped charge 102. Next, the clip 100 is positioned over and pressed onto the posts 106. Because the tabs 114 interferingly engage the outer diameter of the post 106, pressure is applied to temporarily deform the tabs 114 as the post 106 slides through the central opening 112. Once the tabs 114 are adjacent to the circumferential groove 116, the tabs 114 snap back to the original shape and seat within the groove 116. At this stage, the detonator cord 20 will be securely nested in the medial portion 110 and compressed against the shaped charge 102. Furthermore, the bridge portions 111 act as axial guards that restrict movement of the clip 100 along the long axis A of the perforating gun 10 (FIG. 1A). For example, if the clip 100 gets caught on a portion of the carrier tube 14 or other part of the perforating gun 10, one of the bridge portions 111 will bump up against the post 106 and prevent the clip 100 from sliding off the post 106. It will be appreciated that this interfering engagement between the bridge 111 and the post 106 can reduce the likelihood that the clip 100 will become dislodged from the post 106 during installation.

To remove the clip 100, a suitable removal tool (not shown) such as a screwdriver, rod, or bar may be inserted into a handling slot 120, or hole of another configuration, which is adapted to receive such removal tool. The removal tool is then positioned to create a fulcrum point on the post 106 and rotated. This rotation readily snaps the clip 100 off the shaped charge 102.

Figure 4:
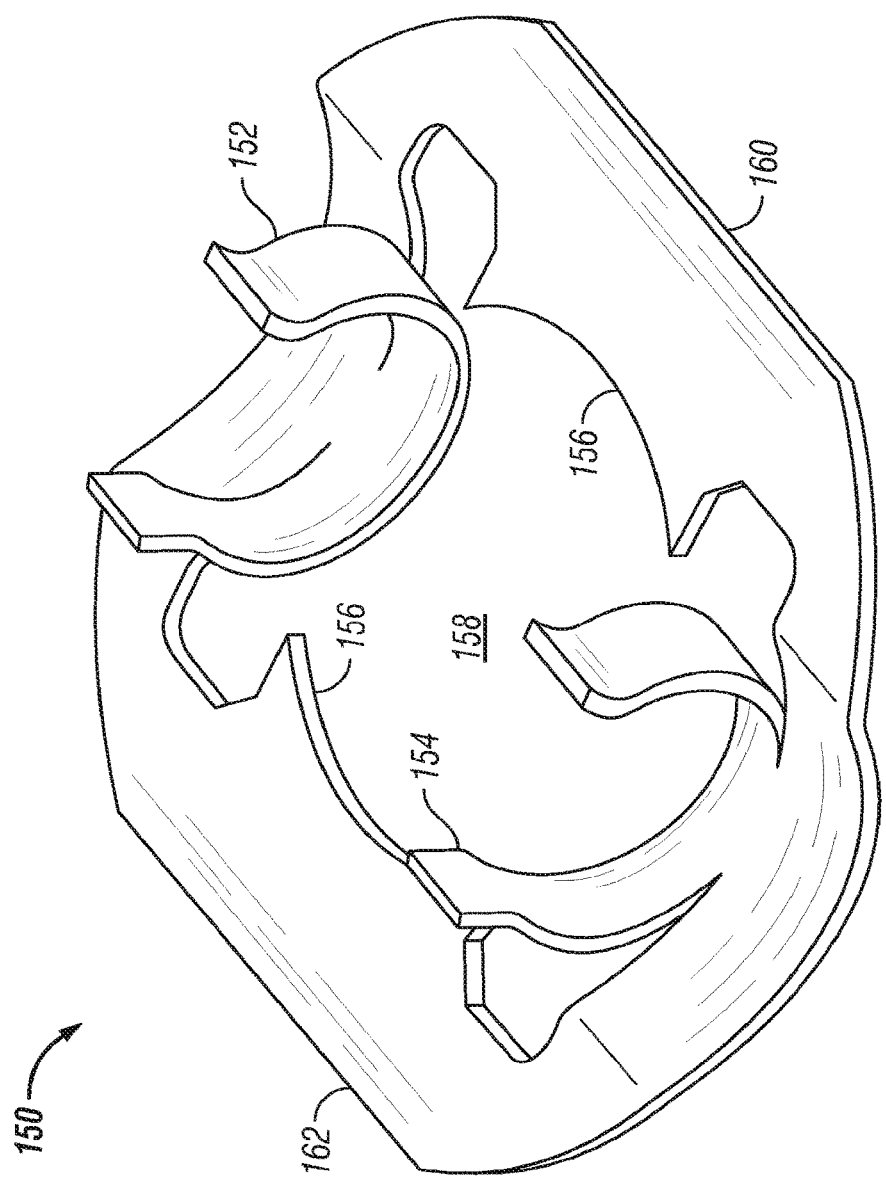
FIG. 4 schematically illustrates an embodiment of a detonator cord retention member according to the present invention that utilizes one or more fingers.

Referring now to FIGS. 3 and 4, there is shown another embodiment of a clip 150 for energetically coupling a detonator cord 20 to a shaped charge 102. The clip 150 includes two axially spaced apart sets of pairs of fingers 152, 154, a pair of tabs 156, and a central opening 158. The pairs of fingers 152, 154 are formed in a portion that underlies the detonator cord 102 and are formed of a flexible material that can bend outward to receive the detonator cord 20 and thereafter seeks to retain its original shape to capture the detonator cord 102. The height of the fingers 152, 154 are selected to minimize the portion of the fingers 152 and 154 that extends radially beyond the post 106. While the fingers 152, 154 are shown as curved members that conform to the cross-sectional profile of the detonator cord 20, such a shape is not necessary. In other embodiments, no portion of the fingers 152, 154 extends radially beyond the post 106; i.e., the tips of the fingers 152, 154 are radially flush with or radially recessed from the radially outermost portion of each post. As in the FIG. 3 embodiment, the tabs 156 are generally flexible members adapted to seat within the circumferential groove 116. Optionally, a handling slot (not shown) can be formed in one or both of the wings 160 and 162. Further, while two pairs of fingers, 152 and 154, are shown, a single pair of fingers can also be used in certain embodiments.

It will be noted that any part of a retention member that serves to grasp the detonator cord is herein generally referred to as a grasping portion. Thus, a grasping portion may be configured as a bridge portion 111, or as a pair of fingers 152 or 154, or a combination of two or more of these, or the like. While any of the embodiments thereof may be substantially arcuate, which may be particularly convenient in the case of an axially cylindrical detonator cord, the precise geometry of the grasping portion is not critical, provided that the grasping portion securely holds the detonator cord in place relative to the post by inhibiting or, in some embodiments, preventing radial movement of such detonator cord and, in some embodiments, that it does not extend, or does not extend significantly, beyond the post 106 in a radial direction. The result of this reduced extension is that it is less likely than conventional means to be damaged or dislodged during installation of the charge tube 14 in the carrier tube 12. In some embodiments of the present invention detonator cord compression may be employed or may result and is further desirable, to ensure excellent contact between the detonator cord and the shaped charge, thereby increasing the probability of successful detonation. In some embodiments axial movement of the detonator cord 20 and/or post 106 relative to one another is also inhibited, notably where the retention member or clip 100 is configured with, as grasping members, paired bridge portions 111 or sets of paired fingers 152, 154 such that axial movement of the detonator cord 20 is stopped, in either direction, by the interaction of such grasping member with both the detonator cord 20 and the post 106.

It is contemplated that suitable materials for the described embodiments include hardened spring steel and other metallic and non-metallic flexible materials. However, the present invention is not limited to any particular material. Furthermore, while integral locking tabs have been described, it should be understood that other suitable locking arrangements can be utilized to secure the retention member to the post. Still further, the teachings of the present invention can be advantageously applied to any number of conventional perforating gun arrangements, not merely the arrangements previously described. Still further, while certain features have been shown and discussed with respect to certain figures, it should be understood that the features discussed can be interchangeable among the several figures.

Figure 5:
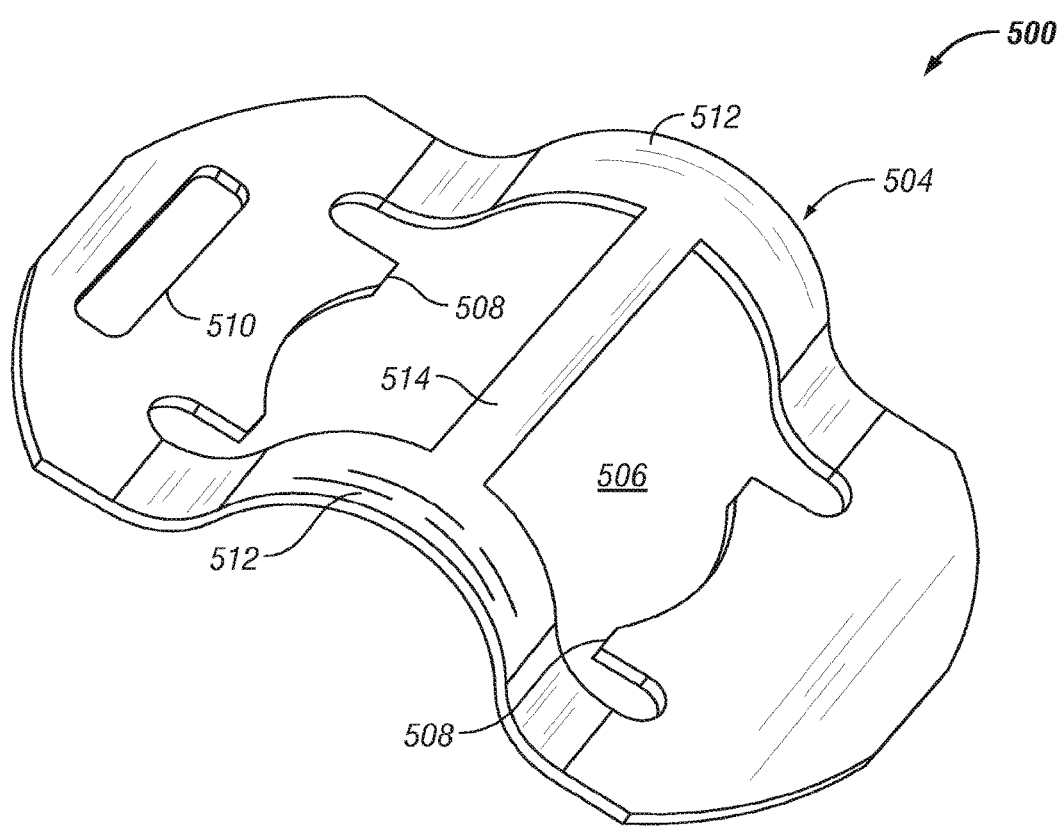
FIG. 5 schematically illustrates an embodiment of a detonator cord retention member according to the present invention that uses a support member, and FIG. 6 schematically illustrates an embodiment of a detonator cord retention member according to the present invention that uses a flexure element.

Referring now to FIG. 5, there is shown another embodiment of a retention member 500 that energetically couples a detonator cord 20 (FIG. 2) to a shaped charge 102 (FIG. 2). The FIG. 5 embodiment is generally similar to the FIG. 2 embodiment and includes an arcuate medial portion 504, a central opening 506, radially inwardly pointing tabs 508, and a handling slot 510. These elements have already been discussed with reference to FIG. 2 and will not be discussed in further detail. Referring now to FIGS. 2 and 5, the medial portion 504, which includes one or more bridge portions 512, is shaped to overlie the detonator cord 20 and press the detonator cord 20 against the shaped charge 102 to energetically couple the detonator cord 20 to the shaped charge 102. To enhance the coupling of the detonator cord 20 to the shaped charge 102, the medial portion 504 also includes a support member 514 that provides an additional clamping force on the detonator cord 20. The support member 514 presses down on at least a portion of the detonator cord 20 between bridge members 512 such that an energetic coupling is maintained between that portion of the detonator cord 20 and the shaped charge 102. In one embodiment, the support member 514 is a bar-like portion that spans between the bridge portions 512 and runs generally parallel with the detonator cord 20. The support member 514 can be integrally formed with the retention member 500 as shown or can be a separate element. Like the FIG. 2 embodiment, the retention member 500 can have only a radially outermost portion of the retention member 500 lying radially beyond, or lie flush with or radially recessed from the post 106.

Figure 6:
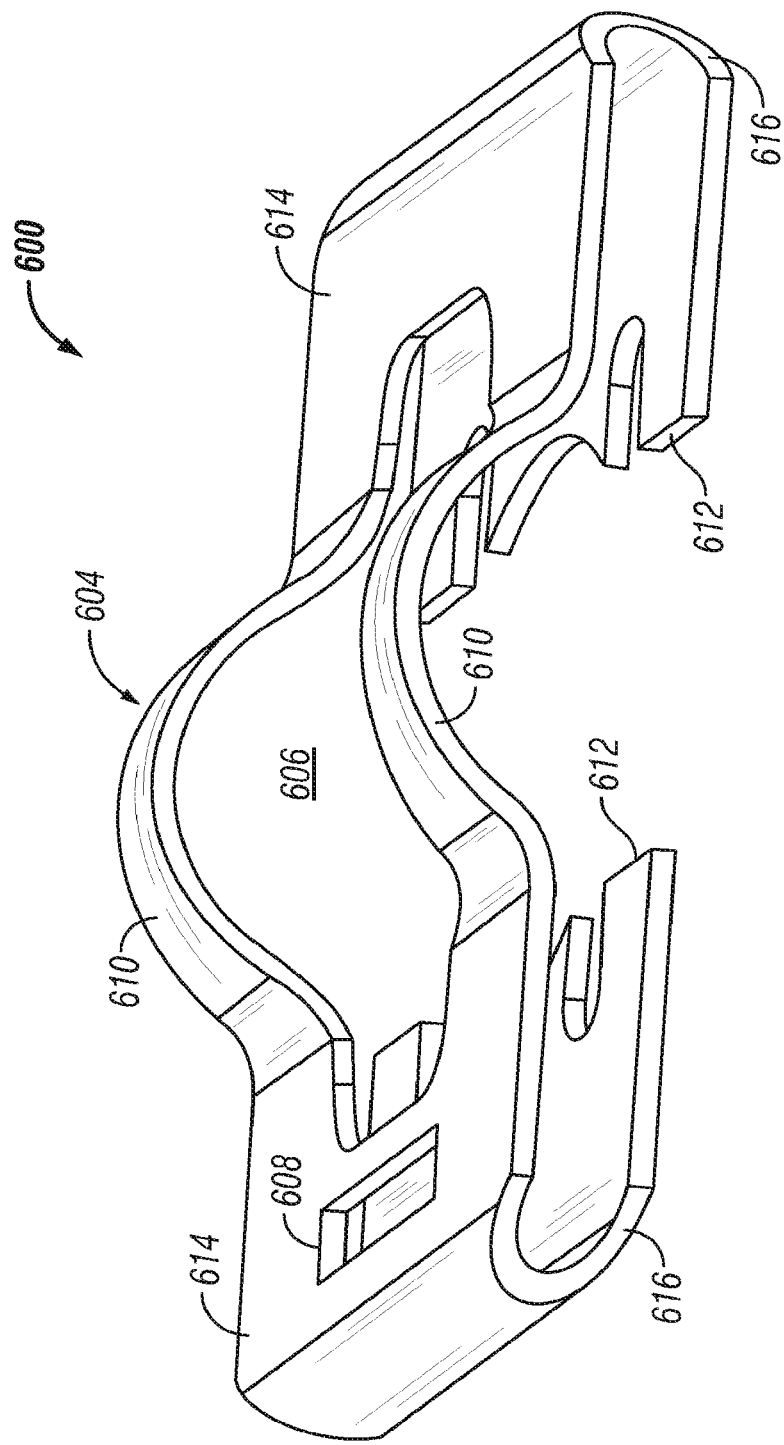

Referring now to FIG. 6, there is shown still another embodiment of a retention member 600 that energetically couples a detonator cord 20 (FIG. 2) to a shaped charge 102 (FIG. 2). The FIG. 6 embodiment is generally similar to the FIG. 2 embodiment and includes an arcuate medial portion 604, a central opening 606, and a handling slot 608. The medial portion 604, which includes one or more bridge portions 610, is shaped to overlie the detonator cord 20 and press the detonator cord 20 against the shaped charge 102 to energetically couple the detonator cord 20 to the shaped charge 102. In the FIG. 6 embodiment, inwardly pointing tabs 612 are flexible members that are adapted to snap and seat within the circumferential groove 116 in a manner previously described. The tabs 612, however, are formed to flex relative to one or more portions of the retention member 600. In one embodiment, the tabs 612 are connected to an outer portion 614 of the retention member 600 by a flexure element 616. It should be appreciated that the flexure elements 616 allows the gap or spacing between the tabs 616 and the bridge portions 610 to vary, e.g., increase or decrease. More generally, the flexure elements 616 provide a flexure that allows the retention member 600 to bend, twist, and deform as needed to facilitate the installation or removal of the retention member 600. It should be appreciated that the flexure element 616 can be positioned anywhere on the body of the retention member 600, not just between the tabs 612 and the outer portion 614. Furthermore, although two flexure elements 616 are shown, it should be understood that in some embodiments, only one of the tabs 612 can be connected with the flexure element 616. The other tab 612 can be formed as shown in the previous figures or in some other configuration. Like the FIG. 2 embodiment, the retention member 600 can have only a radially outermost portion of the retention member 600 lying radially beyond, or lie flush with or radially recessed from the post 106. The other elements of the FIG. 6 embodiment have already been discussed previously, such as with reference to FIG. 2, and will not be discussed in further detail.

From the above, it should be appreciated that embodiments of the present disclosure include retention members that have a major portion positioned radially recessed from the most radially outward portion of a post. A "major portion" generally denotes at least slightly more than half, and in some embodiments significantly more than half. In other embodiments, substantially all of the retention member lies radially flush with or is radially recessed relative to the radially outermost portion of each post. In embodiments, a retention member may have only a portion applying pressure to a detonator cord lying radially further outward than the radially outermost portion of each post.

The foregoing description is directed to particular embodiments of the present invention for the purpose of illustration and explanation. It will be apparent, however, to one skilled in the art that many modifications and changes to the embodiment set forth above are possible without departing from the scope of the invention. It is intended that the following claims be interpreted to embrace all such modifications and changes.

What is claimed is:

1. An apparatus for perforating a wellbore, comprising:
   a carrier tube having an interior bore;
   a detonator cord disposed in the carrier tube, the detonator cord having a circular cross-sectional profile;
   a charge assembly including a plurality of shaped charges disposed in the carrier tube, each shaped charge having a radially outward pointing post having a slot receiving the detonator cord, wherein the post extends out of a rear of each of the shaped charges, wherein a jet formed by each of the shaped charges exits from a side opposite to the rear of each of the shaped charges; and
   a retention member associated with each post, the retention member including an opening for receiving the post, wherein the retention member includes a medial curved bridge portion that conforms to the profile of the detonator cord, the medial curved bridge portion being circumferentially adjacent to the post such that it inhibits axial movement of the detonator cord, all of the detonator cord and the retention member being radially recessed relative to the radially outermost portion of the post.

2. The apparatus of claim 1, wherein the plurality of shaped charges are affixed in one of: (i) a strip, and (ii) a tube.

3. The apparatus of claim 1, further comprising a slot formed in the retention member, the slot being positioned next to the opening.

4. The apparatus of claim 1, wherein the retention member includes at least one tab projecting into the opening, the tab being radially inward of the outermost portion of the medial curved bridge.

5. The apparatus of claim 1, wherein the retention member includes at least one tab projecting into the opening, and wherein the at least one tab is only formed on the non-medial bridge curved portion of the retention member.

* * * * *